(12) United States Patent
Tailliet (10) Patent No.: US 9,159,430 B2
(45) Date of Patent: Oct. 13, 2015

(54) METHOD FOR BLOCK-ERASING A PAGE-ERASABLE EEPROM-TYPE MEMORY

(71) Applicant: STMicroelectronics (Rousset) SAS, Rousset (FR)

(72) Inventor: Francois Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/293,860

(22) Filed: Jun. 2, 2014

(65) Prior Publication Data

US 2014/0362640 A1     Dec. 11, 2014

(30) Foreign Application Priority Data

Jun. 5, 2013     (FR) ...................................... 13 55179

(51) Int. Cl.
| | | |
|---|---|---|
| G11C 16/14 | (2006.01) | |
| G11C 16/04 | (2006.01) | |
| G11C 16/16 | (2006.01) | |
| G11C 16/30 | (2006.01) | |
| G11C 11/56 | (2006.01) | |

(52) U.S. Cl.
CPC ............... *G11C 16/14* (2013.01); *G11C 16/16* (2013.01); *G11C 11/5635* (2013.01); *G11C 16/0483* (2013.01)

(58) Field of Classification Search
CPC ..... G11C 16/14; G11C 16/0483; G11C 16/16; G11C 11/5635
USPC .............. 365/185.12, 185.29, 230.08, 185.33
See application file for complete search history.

(56) References Cited

U.S. PATENT DOCUMENTS

| | | | |
|---|---|---|---|
| 5,687,121 A | 11/1997 | Lee et al. | |
| 2003/0145151 A1 | 7/2003 | Matsushita et al. | |
| 2004/0151031 A1* | 8/2004 | Tanaka ..................... | 365/185.29 |
| 2005/0095769 A1* | 5/2005 | Takase et al. ................. | 438/200 |
| 2005/0204212 A1* | 9/2005 | Noguchi et al. .............. | 714/710 |
| 2005/0276129 A1* | 12/2005 | Meihong et al. ............. | 365/200 |
| 2006/0187738 A1* | 8/2006 | Suda et al. ............... | 365/230.03 |
| 2008/0205164 A1* | 8/2008 | Pyeon ...................... | 365/185.29 |
| 2009/0268532 A1* | 10/2009 | De Ambroggi et al. . | 365/189.16 |
| 2011/0145490 A1* | 6/2011 | Lee et al. ...................... | 711/103 |
| 2012/0243328 A1* | 9/2012 | Tatebe et al. ............. | 365/185.22 |
| 2013/0135931 A1* | 5/2013 | Namai ..................... | 365/185.11 |
| 2014/0056073 A1* | 2/2014 | Um et al. ................. | 365/185.12 |
| 2015/0078086 A1* | 3/2015 | Lee .......................... | 365/185.11 |

* cited by examiner

*Primary Examiner* — Ly D Pham
(74) *Attorney, Agent, or Firm* — Seed IP Law Group PLLC (57) ABSTRACT

A method for erasing a page-erasable EEPROM-type memory includes: the memory receiving a command associated with a set of addresses of pages of the memory to be erased, each page comprising several memory cell groups each forming a word, for each address of the set of addresses, selecting a word line corresponding to a page of the memory, and triggering the simultaneous erasing of all the selected word lines.

16 Claims, 4 Drawing Sheets

METHOD FOR BLOCK-ERASING A PAGE-ERASABLE EEPROM-TYPE MEMORY

BACKGROUND

1. Technical Field

The present disclosure relates to an erasing method adapted to a page-erasable EEPROM-type memory (Electrically Erasable Programmable Read-Only Memory).

2. Description of the Related Art

One of the main differences between a Flash-type memory and an EEPROM-type memory lies in the erase-granularity, i.e., the minimum number of memory cells likely to be erased during an erase cycle. Generally, the erase-granularity of an EEPROM memory is one page or one byte, whereas that of a Flash memory is one sector of several pages the number of which depends on the memory architecture. Furthermore, the physical size of a memory cell is a significant factor distinguishing Flash- and EEPROM-type memories. The memory cell of a Flash-type memory is typically three or four times smaller than an EEPROM-type memory cell. However, to write a single word in a Flash memory it is necessary to re-program a full sector of the memory.

Several solutions have been developed to attempt to benefit both from the reduced size of Flash-type memory cells and from the reduced erase-granularity of EEPROM memories. Generally, these solutions involve emulating an EEPROM memory using a Flash memory. A classic solution includes using a random access memory (RAM) to store a sector in which a word must be written. This solution implements a mechanism of writing a word, configured to load into the random access memory the sector containing the address of the word to be written, and the word to be written at this address, to control the erasing in the Flash memory of the sector loaded into the random access memory, and to transfer the sector from the random access memory to the Flash memory. This solution has also been adapted to solely page-erasable EEPROM memories, which correspond to one line of memory cells of the memory, to reduce the erase-granularity to the size of a word.

This solution has several disadvantages. It requires relatively large additional circuits, comprising a management circuit and a random access memory. It triggers cycles of erasing and programming not only the memory cells to be changed, but also all the other memory cells of the accessed sector. The result is a high consumption of energy and time compared to the writing of a single word in a word-erasable EEPROM memory. Given that a memory cell can only withstand a limited number of erase and program cycles, typically a hundred thousand cycles, this solution considerably reduces the service life of the memory. Furthermore, the two sector transfers between the Flash memory and the random access memory increase the risk of corrupting data.

It may therefore be desirable to combine the advantages of EEPROM memories, in particular in terms of erase-granularity, with the possibility offered by Flash memories of erasing extended to the scale of an entire sector.

BRIEF SUMMARY

Some embodiments relate to a method for erasing a page-erasable EEPROM-type memory, the method comprising steps of: the memory receiving a command associated with a set of addresses of pages of the memory to be erased, each page comprising several memory cell groups each forming a word, for each address of the set of addresses, selecting a word line corresponding to a page of the memory, and triggering the simultaneous erasing of all the selected word lines.

According to one embodiment, the method comprises successive steps of sending each page address of the set of addresses to a word line decoder.

According to one embodiment, a page address is selected by changing to an active state a latch connected to the word line corresponding to the page address to be selected, the latch supplying in an active state and upon receiving an erase-trigger signal, a high erase voltage to the gates of floating-gate transistors of all the memory cells of the word line.

According to one embodiment, the erase command is associated with a list of addresses of pages to be erased.

According to one embodiment, the addresses of pages to be erased are successively received by the memory and are sent as and when they are received by the memory to the word line decoder.

According to one embodiment, the method comprises steps of generating the addresses of pages to be erased ranging between start and end addresses of a block to be erased, received with the erase command.

According to one embodiment, the method comprises steps of generating the addresses of pages to be erased from a start or end address of a block to be erased received with the erase command, the number of page addresses generated corresponding to a number of pages to be erased received with the erase command.

Some embodiments also relate to a page-erasable EEPROM-type memory, comprising several pages each comprising several sets of memory cells each forming a word, the memory cells of a page being connected to a same word line, and to bit lines transversal to the word lines, configured to implement the method defined above.

According to one embodiment, the memory comprises a serial-type command interface, capable of successively receiving each bit forming a command received by the memory.

According to one embodiment, the memory comprises a parallel-type command interface, capable of simultaneously receiving all the bits of a word of a command received by the memory.

According to one embodiment, the memory comprises a word line decoder receiving each address of pages to be erased of the set of addresses, each word line comprising a control gate line connected to a respective latch and to the gates of floating-gate transistors of all the memory cells of the word line, each latch being configured to switch from an inactive state to an active state upon receiving a select signal supplied by the decoder in response to a page address, and to supply the control gate line to which it is connected with a high erase voltage, upon receiving in the active state an erase-trigger signal.

According to one embodiment, the memory is configured to be word-erasable.

BRIEF DESCRIPTION OF THE SEVERAL VIEWS OF THE DRAWINGS

Some examples of embodiments of the present disclosure will be described below in relation with, but not limited to, the following figures, in which.

DETAILED DESCRIPTION

Figure 1:
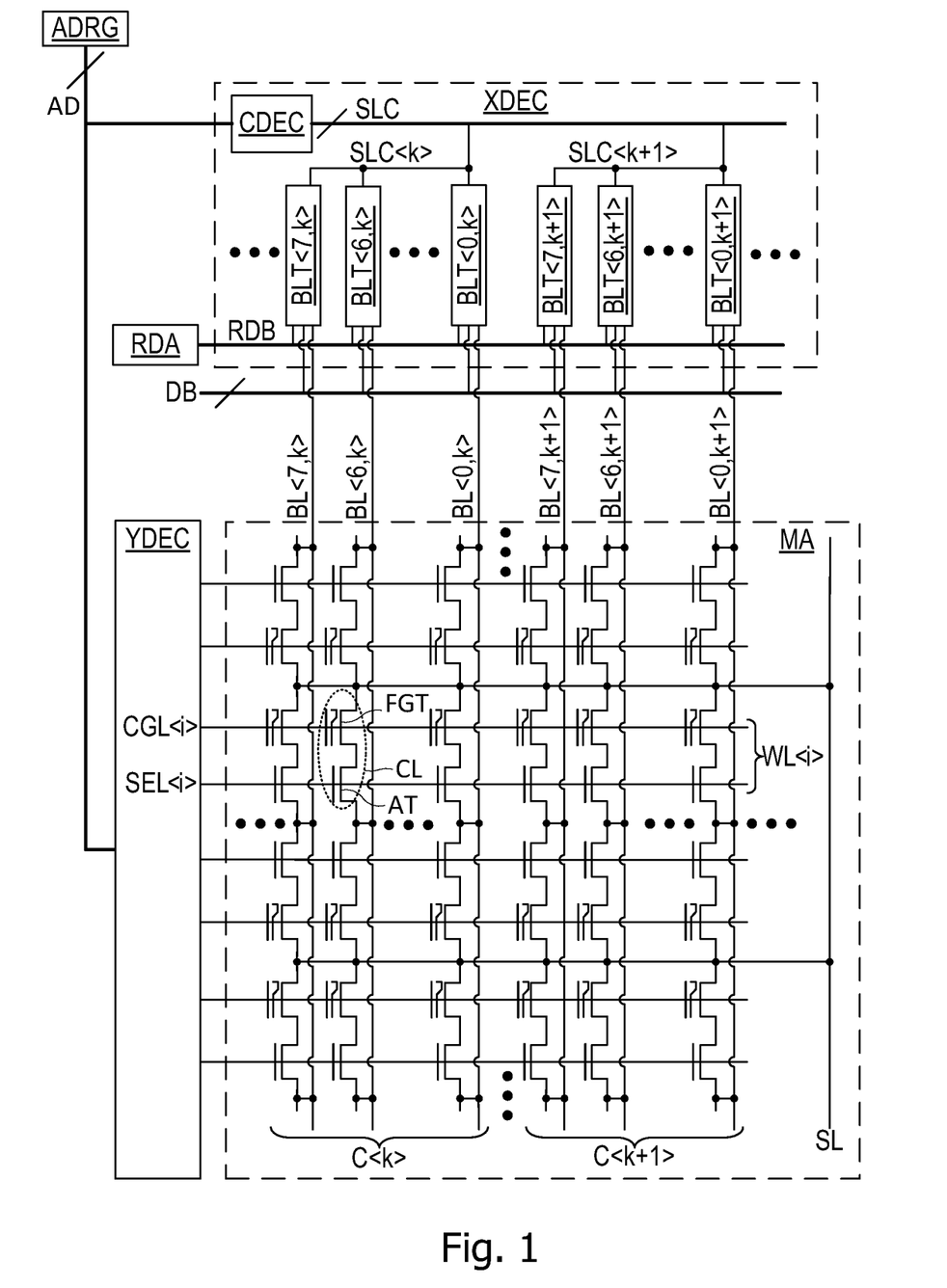
FIG. 1 represents circuits of a page-erasable EEPROM memory.

FIG. 1 represents a page-erasable EEPROM memory, and in particular, a memory array MA and decoding circuits XDEC, YDEC. The memory array MA comprises memory cells CL arranged in word lines WL<i> and in bit lines BL<j,k> transversal to the word lines, several bit lines forming a word column C<k>, C<k+1>. For more clarity, only four word lines and two word columns have been represented. Each memory cell CL classically comprises a floating-gate transistor FGT in series with an access transistor AT, here of MOS type. The access transistors AT of the memory cells are linked by their drain to the bit lines BL<j,k> (j being an index ranging between 0 and 7 in the example in FIG. 1). The memory cells at the intersection of a word line and of a word column form a group of memory cells comprising M memory cells and enabling a binary word of M bits to be stored (M=8 in the example in FIG. 1).

The column decoder XDEC comprises bit line latches BLT<j,k> that are connected to the bit lines BL<j,k> and are controlled by column select signals SLC<k> supplied by a decoding circuit CDEC. More particularly, the bit line latches BLT<j,k> of the bit lines BL<j,k> of a same column are controlled by the same column select signal SLC<k>. The latches BLT<j,k> are further linked to a data bus DB of the memory, and supply in memory cell programming phase, a high programming voltage supplied for example by a charge pump. This programming voltage is only supplied if the corresponding bit received via the bus DB has the logic programming value (for example the value 1), as otherwise (value 0) the targeted memory cell must remain in the erased state.

The gates of the access transistors AT of the memory cells of a same word line WL<i> are linked to a common select line SEL<i>, that is controlled by the line decoder YDEC. The gates of the transistors FGT of the memory cells of a same word line WL<i> are linked to a control gate line CGL<i>, that is also controlled by the line decoder YDEC. The decoder YDEC thus comprises, for each word line WL<i>, two distinct outputs respectively controlling the select line SEL<i> and the line CGL<i>. The source lines of the transistors FGT of all the memory cells of the memory array MA are connected to a common source line SL.

Therefore, the distribution of the memory cells into columns C<k> to obtain groups of memory cells is determined by the distribution of the signals SLC<k> to the bit line latches BLT<j,k>. It follows that the control line CGL<i> of a word line WL<i> can be used to control all the transistors FGT of the memory cells of the word line.

The line decoder YDEC and the circuit CDEC respectively receive the most significant bits and the least significant bits of an address circulating on an address bus AD linked to an address register ADRG. The decoder YDEC sends control signals to the lines CGL<i> and to the lines SEL<i>. The circuit CDEC supplies the bit line latches BLT<j,k> with the column select signals SLC<k>. These various signals depend on the address present on the bus AD. As the latches BLT<j,k> receive the column select signals SLC<k>, all the latches BLT<j,k> of a same column C<k> are activated simultaneously, which enables the memory cells of a same group to be programmed simultaneously. The word to be written in the memory cells of a selected group is supplied by a data bus DB comprising several transmission lines, each line being connected to all the bit line latches BLT<j,k> of a same rank j. Furthermore, all the bit line latches BLT<j,k> are linked to read amplifiers RDA through a read bus RDB.

For each column C<k> and each word line WL<i>, an operation of programming the memory cells is performed using the bit line latches BLT<j,k> which control the bit lines BL<j,k> of the selected column, and the decoder YDEC of word lines WL<i> which controls the control gate line CGL<i> and the select line SEL<i> of the selected word line. However, an operation of erasing memory cells concerns an entire word line, as it is only performed using the decoder YDEC which controls the control gate line CGL<i> and the select line SEL<i> of the selected word line.

The memory cells of a word line WL<i> are indeed erased by applying to the corresponding control gate line CGL<i> a positive voltage Vpp1, for example supplied by a charge pump. The voltage Vpp1 is for example between 12 and 18V (for example 15V). Simultaneously, the other control gate lines CGL<l> (with l≠i), for example the lines CGL<i−1> and CGL<i+1>, and all the select lines SEL<i> are put to a reference potential Vref1, for example equal to 0 volt (linked to the ground). In addition, all the bit lines BL<j,k> are simultaneously put to a floating potential FL or high impedance, or to the potential Vref1.

An operation of programming memory cells CL1, CL2 belonging to a previously erased group M situated in a column C<k> and belonging to the word line WL<i>, comprises the following operations:

applying a regulated voltage Vpp2 to the line SEL<i> of the word line WL<i>, while the select lines of the other word lines are put to the reference potential Vref1, and applying a voltage equal to Vpp2-Vtn to the bit lines BL<j,k> of the memory cells CL1, CL2 to be programmed, while putting all the other bit lines to the reference potential Vref1 or to a floating potential, Vtn being the threshold voltage of the transistors AT, applying a negative regulated voltage Vref2, supplied by a charge pump for example, to the control gate line CGL<i> of the word line WL<i>, and putting the source lines SL to a floating potential.

The voltage Vref2 is between 0 and −15V. The voltage Vpp2 is between 4 and 17V. The voltage Vtn is in the order of 1V when Vpp2 is in the order of 4V, and in the order of 3V when Vpp2 is in the order of 17V. The source lines SL can be alternatively put to a voltage set at 0V if Vref2 is sufficiently negative (typically below −5V), and otherwise, to a voltage in the order of 5 to 7V.

The values of the control signals during erase and programming operations are summarized in Table 1 below.

TABLE 1

| | Operation | |
| --- | --- | --- |
| Control signal | ERASING | PROGRAMMING |
| SEL<i> | Vref1 | Vpp2 |
| SEL<l> (l ≠ i) | Vref1 | Vref1 |
| CG<i> | Vpp1 | Vref2 |
| CG<l> (l ≠ i) | Vref1 | Vref1 |
| BL<j, k> | Floating | Vpp2−Vtn |
| BL<j, n> (n ≠ k) | Floating | Floating |
| SL | Vref1 | Floating |

Figure 2:
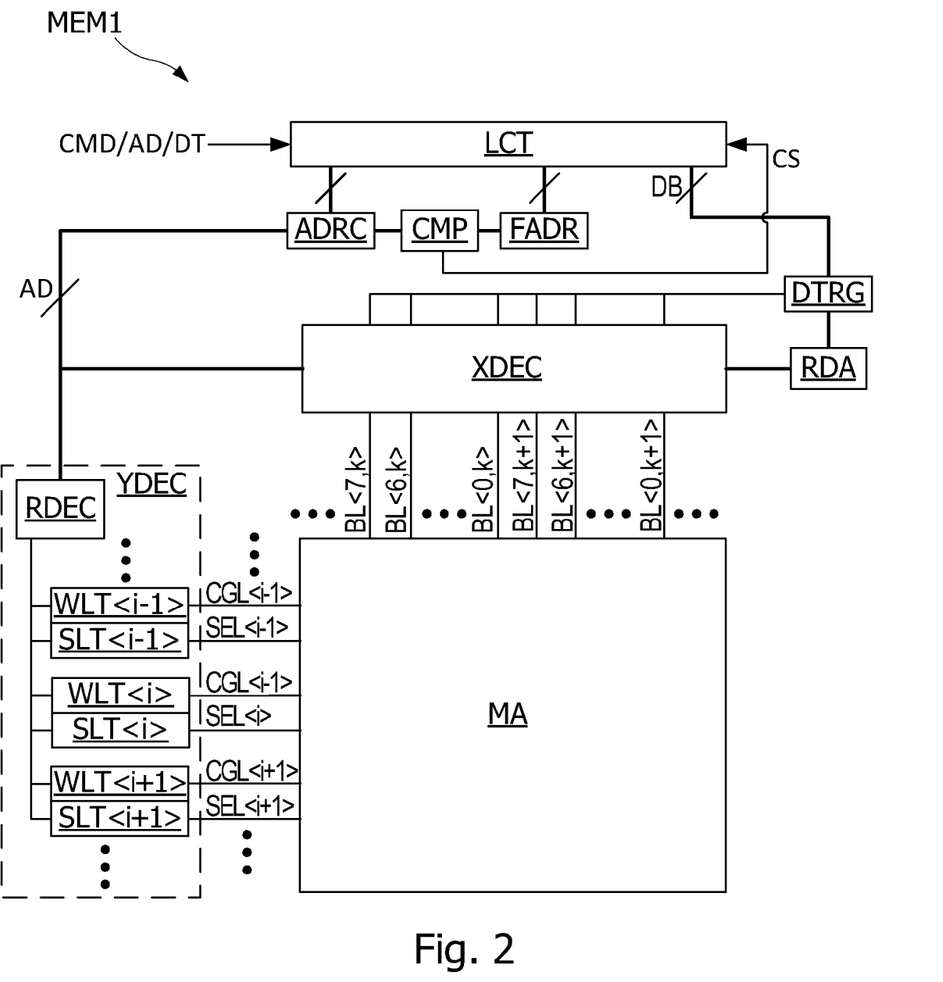
FIGS. 2 to 4 represent a page-erasable EEPROM memory, configured to execute a cycle of erasing several pages, according to various embodiments.

FIG. 2 represents an EEPROM-type memory MEM1 erasable by block of several pages, according to one embodiment. The memory MEM1 comprises the memory array MA and the decoders XDEC, YDEC presented in FIG. 1. The decoder YDEC comprises a decoding circuit RDEC, word line latches WLT<i> each connected to a control gate line CGL<i> and select control latches SLT<i> each connected to a control gate line SEL<i> of the select transistors AT of the word line WL<i>.

The memory MEM1 also comprises a control circuit LCT, an address register/counter ADRC, another address register FADR, a data register DTRG, read amplifiers RDA and a comparator CMP. The circuit LCT is configured to receive commands sent to the memory MEM1, and words read in the memory to be sent outside the memory in response to a read command. A command received by the memory comprises a command CMD code, and depending on the command code, operands that can comprise one or more addresses and possibly data. The command code can be defined on one byte, and the addresses can be defined on one or more bytes, according to the capacity of the memory.

The registers ADRC, FADR are linked to the circuit LCT to receive addresses contained in commands received by the memory MEM1. The register ADRC is also linked to the decoding circuit RDEC. The register ADRC is configured to increment itself upon receiving a control signal supplied by the circuit LCT. The two registers ADRC and FADR are connected to the comparator CMP that is configured to compare the addresses contained in the registers ADRC and FADR and to supply the circuit LCT with a comparison signal CS.

The register DTRG is linked to the circuit LCT to receive a word to be written associated with a word write command. The register DTRG is also linked to the decoder XDEC to supply the bit line latches linked to write-selected memory cells with the bits of a word to be written. The register DTRG is also linked to the read amplifiers RDA to receive the bits read in read-selected memory cells.

The different elements of the memory MEM1 are controlled by the circuit LCT which can be produced using a simple finite state machine. In particular, the circuit LCT is configured to read each command CMD code received by the memory MEM1. The input/output interface of the memory MEM1 can be of serial or parallel type.

According to one embodiment, the memory MEM1 is configured to receive and execute block erase commands, comprising start and end addresses of a block to be erased, these addresses being respectively transferred into the registers ADRC, FADR. The processing of a block erase command can be carried out in the following manner. Once the code of the block erase command CMD has been decoded, the circuit LCT controls the loading into the registers ADRC and FADR of the block start and end addresses, associated with the command code. The circuit LCT then controls the sending to the circuit RDEC of the address (or only of the most significant bits of the address corresponding to a page address) in the register ADRC. This sending can for example be triggered by deselecting the memory MEM1. The receipt of the address by the circuit RDEC triggers the activation of the word line latch WLT<i> of the word line WL<i> corresponding to the address received by the decoder RDEC. Then, until the comparison signal CS coming from the comparator CMP indicates an equality of the content of the registers ADRC and FADR, the circuit LCT controls the incrementing of the address in the register ADRC and the sending of this incremented address to the circuit RDEC. The register ADRC is incremented each time so that the register contains the address of the next page. Thus, upon each increment of the register ADRC, a new word line latch WLT<i> is activated.

When the signal CS indicates an equality of the addresses in the registers ADRC and FADR, the circuit LCT activates an erase command by controlling the decoders XDEC, YDEC to supply the memory array MA with the erase voltages indicated in Table 1. All the memory cells of the word lines WL<i> connected to the previously activated word line latches WLT<i> are thus simultaneously erased.

An iteration including an increment of the register ADRC can be typically carried out in 50 ns, i.e., 50 μs for a block of one thousand pages, which is much lower than the generally allowed erase time of a few milliseconds.

It will be understood that the addresses of the pages of the block to be erased can be generated in a reverse order, i.e., starting with the end address of the block. For this purpose, the end address of the block to be erased is decremented until the address of the first page of the block is reached.

Figure 3:
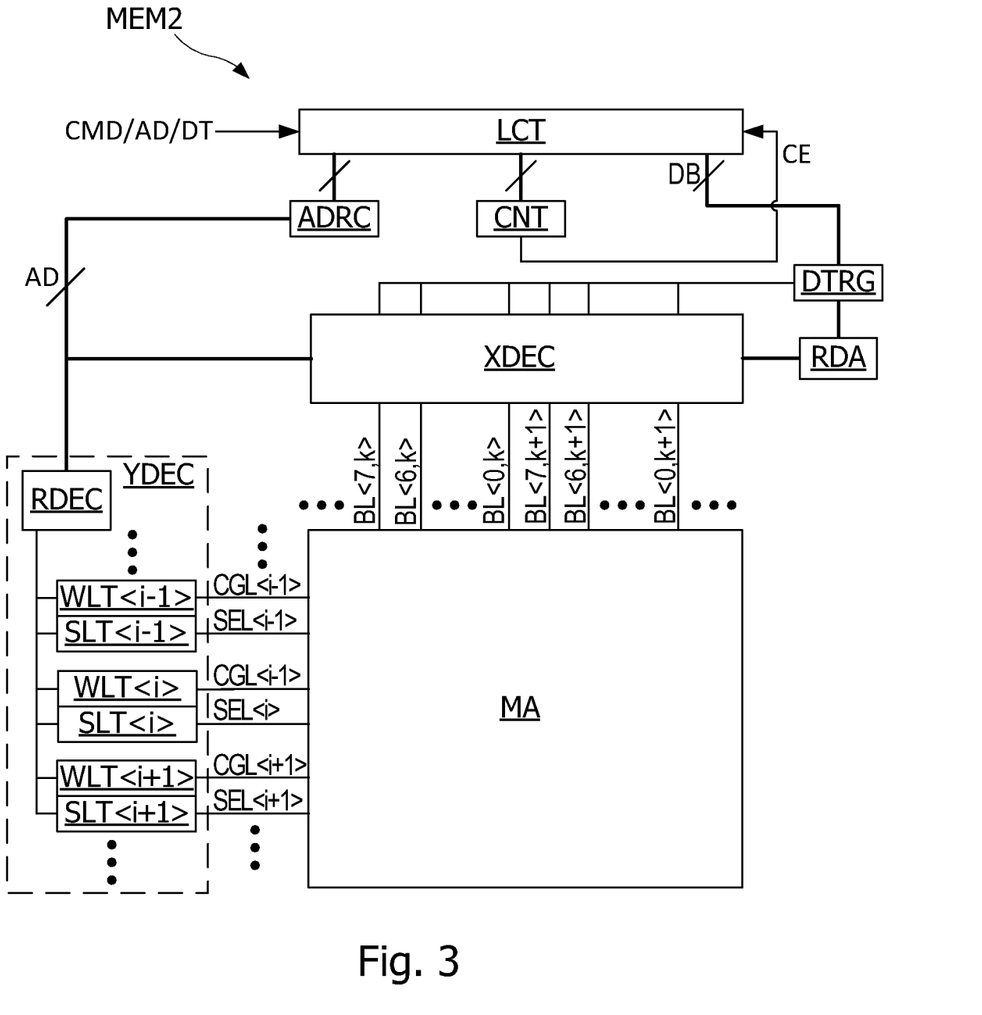

FIG. 3 represents an EEPROM-type memory MEM2 erasable by block of several pages, according to another embodiment. The memory MEM2 differs from the memory MEM1 in that it comprises a counter CNT linked to the circuit LCT. The counter CNT supplies the control circuit LCT with an end-of-counting signal CE indicating whether or not the value of the counter is zero.

The memory MEM2 is configured to receive erase commands for erasing blocks of several pages, comprising a command CMD code, a start address and a number of pages of the block to be erased. The counter CNT is configured to receive a number of pages to be erased sent with a block erase command. The number of pages to be erased can be defined on one or more bytes according to the capacity of the memory. Once the code of the block erase command CMD has been decoded, the circuit LCT controls the loading of the block start address into the register ADRC, and of the number of pages of the block into the counter CNT as initial counting value. The circuit LCT then controls the sending to the circuit RDEC of the address (or only of the most significant bits of the address corresponding to a page address) in the register ADRC. This sending can for example be triggered by deselecting the memory MEM2. The receipt of the address by the circuit RDEC triggers the activation of the word line latch WLT<i> of the word line WL<i> corresponding to the address received by the decoder RDEC. Then, while the counting signal CE coming from the counter CNT indicates that the counter CNT is not zero, the circuit LCT controls the incrementing of the address in the register ADRC and the sending of this incremented address to the circuit RDEC, and the decrementing of the counter CNT. The register ADRC is incremented each time so that the register contains the address of the next page. Thus, upon each increment of the register ADRC, a new word line latch WLT<i> is activated.

When the signal CE indicates that the value of the counter CNT is zero, the circuit LCT activates the erasing of the block by controlling the decoders XDEC, YDEC to supply the memory array MA with the erase voltages indicated in Table 1, and thus simultaneously erase all the memory cells of the word lines WL<i> connected to the previously activated word line latches WLT<i>.

According to one alternative embodiment, the number of pages to be erased can be loaded into an additional register, for example the register FADR, the counter CNT being reset to 0 and compared to the content of the additional register upon each increment of the register ADRC.

It will be understood that the block erase command can be associated with the end address of the block to be erased, rather than with the start address of the block. In this case, the block end address can be loaded into the register ADRC that is then decremented to generate all the page addresses of the block.

Figure 4:
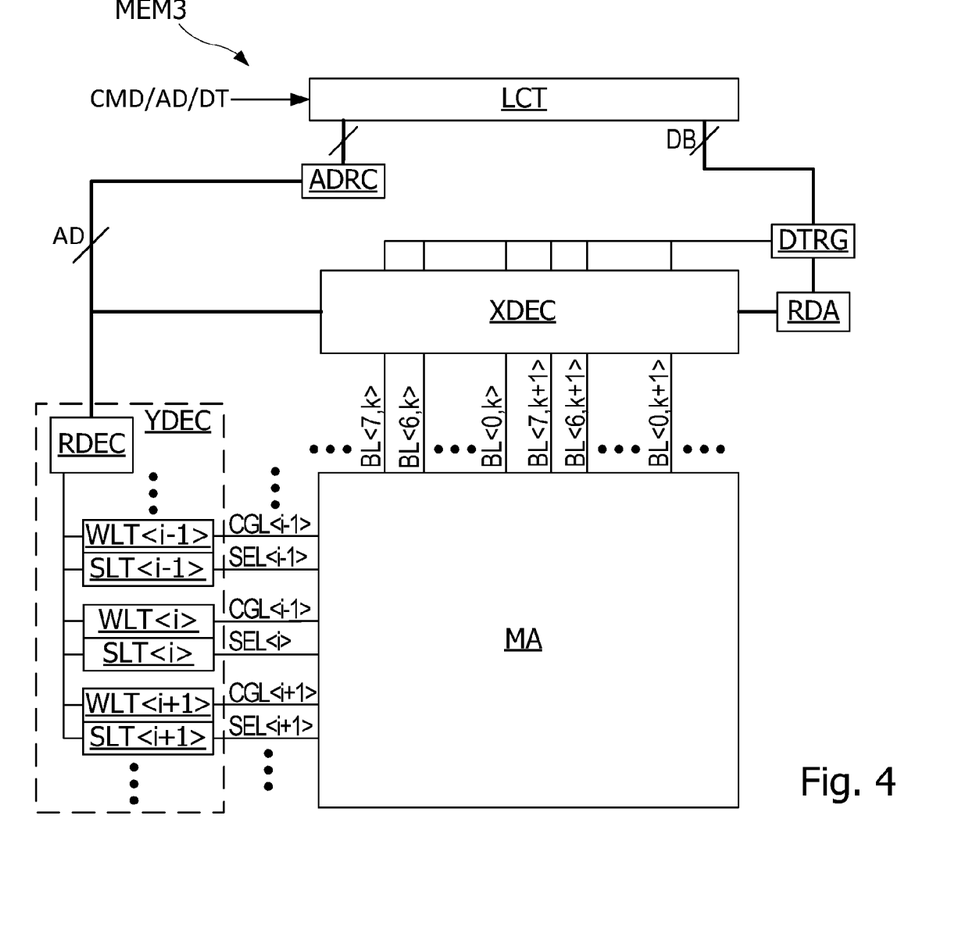

FIG. 4 represents an EEPROM-type memory MEM3 erasable by set of several pages, according to another embodiment. The memory MEM3 is configured to receive erase commands for erasing several pages, comprising a command CMD code, and the addresses of the pages to be erased. Once the code of the page erase command CMD has been decoded, the circuit LCT successively controls the loading of the addresses of the pages to be erased into the register ADRC. This loading can be carried out as and when the addresses of pages to be erased are received by the circuit LCT. Upon each loading of a new address into the register ADRG, this address (or only most significant bits of the address corresponding to a page address) is sent to the circuit RDEC. The receipt of the address by the circuit RDEC triggers the activation of the word line latch WLT<i> of the word line WL<i> corresponding to the address received by the decoder RDEC. Thus, the word line latches WLT<i> corresponding to the addresses of the pages to be erased are successively activated. When the memory MEM3 is deselected, thus marking the end of the sending of the addresses of pages to be erased, the circuit LCT activates the erasing by controlling the decoders XDEC, YDEC to supply the memory array MA with the erase voltages indicated in Table 1, and thus simultaneously erase all the memory cells of the word lines WL<i> connected to the activated word line latches WLT<i>.

According to one embodiment, the features of several of the memories MEM1, MEM2 and MEM3 are combined in a single memory capable of processing several of the erase commands for erasing a set of pages described above. These commands thus comprise:

an erase command for erasing a block defined by block start and end addresses (FIG. 2), an erase command for erasing a block defined by a block start address and a block size defined for example by a number of pages (FIG. 3), and an erase command for erasing a set of pages each defined by a page address (FIG. 4).

Each of these commands can comprise a distinct command CMD code. To be capable of executing these commands, the memory may comprise the register/counter ADRC, another register/counter FADR which can receive either the end address of the block, or the number of pages of the block, and the comparator CMP to compare the values of the two registers ADRC and FADR.

Figure 5:
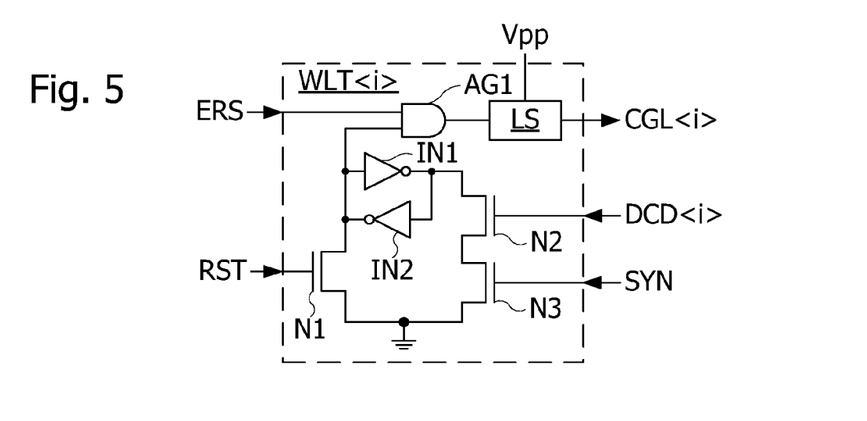
FIG. 5 represents an example of a word line latch circuit of the memory represented in FIG. 2, 3 or 4.

FIG. 5 represents circuits of a word line latch WLT<i>, according to one example of an embodiment. The latch WLT<i> comprises two inverters IN1, IN2 mounted head-to-tail and ensuring the actual latch function, an AND-type logic gate AG1, and n-channel MOS-type transistors N1 to N3. The input of the inverter IN1 and the output of the inverter IN2 are connected to a drain terminal of the transistor N1 and to an input of the gate AG1. The transistor N1 comprises a source terminal linked to the ground and a gate terminal receiving a reset signal RST. The output of the inverter IN1 and the input of the inverter IN2 are connected to a drain terminal of the transistor N2. The transistor N2 comprises a gate terminal receiving a decoding signal DCD<i> coming from the decoding circuit RDEC, and a source terminal connected to a drain terminal of the transistor N3. The transistor N3 comprises a gate terminal receiving a synchronization signal SYN from the circuit LCT, and a source terminal connected to the ground.

Another input of the gate AG1 receives an erase control signal ERS. The output of the gate AG1 is connected to a level shifter circuit LS further receiving a voltage Vpp coming from a charge pump of the memory. The output of the circuit LS is connected to the control gate line CGL<i> of a word line WL<i>. The signals RST, SYN and ERS are supplied to the latches WLT<i> by the circuit LCT. The latch formed by the inverters IN1, IN2 changes to the high state as soon as a simultaneous pulse appears in the signals DCD<i> and SYN, rendering the transistors N2 and N3 on. The output of the inverter IN1 and the input of the inverter IN2 are then grounded. The output of the inverter IN2 and the input of the inverter IN1 thus change to the high state. The latch formed by the inverters IN1, IN2 is put to the low state by a pulse of the signal RST, rendering the transistor N1 on. The input of the inverter IN1 and the output of the inverter IN2 are then grounded. The output of the inverter IN1 and the input of the inverter IN2 thus change to the high state.

Before processing an erase command CMD received, the circuit LCT controls the reset of the latches WLT<i> by means of a pulse of the signal RST. Every time a new address is decoded by the decoder RDEC, one of the signals DCD<i> becomes active, and a pulse of the signal SYN is generated to change to the high state the latch WLT<i> receiving the signal DCD<i> in the active state. When all the latches WLT<i> corresponding to the pages to be erased are in the high state, the circuit LCT triggers the erasing of the pages or word lines WL<i> thus selected by controlling a charge pump to supply the circuit LS with the voltage Vpp1 and by activating the signal ERS. The activating of the signal ERS causes the output of the gate AG1 to switch to the high state, and thus the erase voltage Vpp1 supplied to the circuit LS to be sent to all the control gate lines CGL<i> of the word lines WL<i> selected by putting the corresponding latches WLT<i> to the high state.

An erase command for erasing by set of several pages or word lines can thus be simply implemented using a modified line decoder YDEC, one or two additional registers, and possibly a comparator CMP. It is thus possible to emulate erase commands of a serial Flash memory with an EEPROM, with a page-erase granularity, rather than a sector-erase granularity. Furthermore, the erasing of a block of several pages is not limited to an entire sector as in a Flash memory, or to contiguous pages of a single sector, but can concern several sectors and non-contiguous pages of different sectors not necessarily contiguous. This results in time and energy savings. When programming several pages, the cycles of erasing the pages to be programmed can indeed be grouped together into a single cycle, the pages being programmed via a program cycle on a page-by-page basis. This results in time saving close to 2.

The block start and end addresses, and the erase command page addresses can be specified in the erase commands received by the memory in the form of word addresses. In this case, only the most significant bits corresponding to the address of a page are taken into account by the decoder RDEC. The page addresses can also be specified in the erase commands in the form of page addresses, i.e., comprising only the most significant bits of a word address corresponding to the address of a page.

It will be understood by those skilled in the art that the present disclosure is susceptible of various alternative embodiments and various applications. In particular, this disclosure does not solely apply to EEPROM memories having an erase-granularity on the scale of a page or word line. Either one or both of the erase commands for erasing by set of several pages can also be implemented in a word-erasable EEPROM memory. In such a memory that is for example described in patent EP1 727 152, the sources of the memory cells are interconnected by word column so as to be capable of supplying the memory cells belonging to the word columns not to be erased with an erase-inhibit source voltage. When executing an erase command for erasing by set of pages, all the sources of the memory cells of the memory are put to the voltage Vref1.

The present disclosure is not limited either to the processing of an erase command, given that a program command includes a prior erase of the pages or of the words to be programmed.

The input/output interface of the memory can be of serial or parallel type.

The maximum size of the block to be erased that can reach the size of the memory, is limited only by the fan-out of the charge pump supplying the control gate lines CGL<i> with the high voltage.

Furthermore, storage means other than the word line latches may be implemented to store the selection of a word line. These storage means can for example comprise register cells each linked to a word line.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
receiving at a page-erasable EEPROM memory an erase command associated with a set of addresses of pages of the memory to be erased, each page including plural groups of memory cells, each group forming a hardware word, the memory including a plurality of word lines corresponding respectively to the pages;
selecting word lines respectively corresponding to the addresses of the set; and
concurrently erasing all the selected word lines, wherein selecting the word lines includes, for each of the word lines respectively corresponding to the addresses of the set, changing to an active state a latch coupled to the word line, the latch supplying a high erase voltage to gates of floating-gate transistors of all the memory cells of the word line in response to receiving an erase-trigger signal.

2. The method according to claim 1, comprising successively sending each page address of the set of addresses to a word line decoder in response to receiving the erase command, the word line decoder concurrently selecting the word lines respectively corresponding to the addresses of the set in response to receiving the page addresses.

3. The method according to claim 1, wherein receiving the erase command includes successively receiving by a control circuit of the memory the addresses of pages to be erased, the method including successively forwarding the addresses of the pages to be erased from the control circuit to a word line decoder in response to successively receiving the addresses of the pages to be erased by the control circuit.

4. The method according to claim 1, comprising:
receiving with the erase command start and end addresses of a block that includes the pages to be erased; and
generating the addresses of the pages to be erased based on at least one of start and end addresses of the block.

5. The method according to claim 1, comprising:
receiving with the erase command a start address or an end addresses of a block that includes a number of pages, including the pages to be erased;
receiving with the erase command an indication of the number of pages in the block; and
generating the addresses of the pages to be erased from the start address or the end address of the block and the indication of the number of pages in the block.

6. A page-erasable EEPROM-type memory, comprising:
a memory array that includes a plurality of pages each including plural hardware words respectively including plural memory cells, the memory array further including a plurality of word lines corresponding respectively to the pages, the memory cells of each page being coupled to the word line corresponding to the page, and to bit lines transversal to the word lines;
a control circuit configured to receive an erase command associated with a set of addresses of pages of the memory array to be erased, control selection of word lines respectively corresponding to the addresses of the set, and cause all of the selected word lines to be concurrently erased, wherein the word lines respectively include respective control gate lines and the memory cells include respective floating gate transistors that have respective gates; and
a word line decoder configured to receive each address of the pages to be erased of the set of addresses, the word line decoder including a decoding circuit and a plurality of latches respectively coupled by the control gate lines to the gates of the floating-gate transistors of all the memory cells of the respective page, the decoding circuit being configured to provide a select signal in response to receiving a page address, each latch being configured to switch from an inactive state to an active state upon receiving the select signal from the decoding circuit, and to supply the control gate line to which the latch is coupled with a high erase voltage, upon receiving an erase-trigger signal while in the active state.

7. The memory according to claim 6, comprising a serial-type command interface configured to successively receiving each bit of a command received by the memory.

8. The memory according to claim 6, comprising a parallel-type command interface configured to simultaneously receive all bits of a word of a command received by the memory.

9. The memory according to claim 6, comprising a word line decoder configured to select word lines corresponding to the pages to be erased, wherein the control circuit is configured to successively receive the addresses of the pages to be erased, successively forward the addresses of the pages to be erased to the word line decoder in response to successively receiving the addresses of the pages to be erased.

10. The memory according to claim 6, wherein the control circuit is configured to receive with the erase command start and end addresses of a block that includes the pages to be erased, and generate the addresses of the pages to be erased based on at least one of start and end addresses of the block.

11. The memory according to claim 6, wherein the control circuit is configured to receive with the erase command a start address or an end address of a block that includes a number of pages, including the pages to be erased; receive with the erase command an indication of the number of pages in the block; and generate the addresses of the pages to be erased from the start address or the end address of the block and the indication of the number of pages in the block.

12. The memory according to claim 6, wherein the control circuit is configured to receive with the erase command a start address or an end address of a block that includes a number of pages, including the pages to be erased, the memory comprising:
an address register/counter configured to store the start address or end address received with the erase command, output the start address or end address received with the erase command, and produce at least one additional address of at least one of the pages of the block based on the start address or end address received with the erase command; and a row decoder configured to receive the start address or end address received with the erase command, receive the at least one additional address, and concurrently select, for erasing, the pages corresponding to the start address or end address received with the erase command and the at least one additional address.

13. A method, comprising:

receiving at a page-erasable EEPROM memory an erase command associated with a set of addresses of pages of the memory to be erased, each page including plural groups of memory cells, each group forming a hardware word, the memory including a plurality of word lines corresponding respectively to the pages;

selecting word lines respectively corresponding to the addresses of the set;

concurrently erasing all the selected word lines;

receiving with the erase command a start address or an end addresses of a block that includes a number of pages, including the pages to be erased;

receiving with the erase command an indication of the number of pages in the block; and generating the addresses of the pages to be erased from the start address or the end address of the block and the indication of the number of pages in the block.

14. The method according to claim 13, comprising successively sending each page address of the set of addresses to a word line decoder in response to receiving the erase command, the word line decoder concurrently selecting the word lines respectively corresponding to the addresses of the set in response to receiving the page addresses.

15. A page-erasable EEPROM-type memory, comprising:

a memory array that includes a plurality of pages each including plural hardware words respectively including plural memory cells, the memory array further including a plurality of word lines corresponding respectively to the pages, the memory cells of each page being coupled to the word line corresponding to the page, and to bit lines transversal to the word lines; and a control circuit configured to receive an erase command associated with a set of addresses of pages of the memory array to be erased, control selection of word lines respectively corresponding to the addresses of the set, and cause all of the selected word lines to be concurrently erased, wherein the control circuit is configured to receive with the erase command a start address or an end address of a block that includes a number of pages, including the pages to be erased;

an address register/counter configured to store the start address or end address received with the erase command, output the start address or end address received with the erase command, and produce at least one additional address of at least one of the pages of the block based on the start address or end address received with the erase command; and a row decoder configured to receive the start address or end address received with the erase command, receive the at least one additional address, and concurrently select, for erasing, the pages corresponding to the start address or end address received with the erase command and the at least one additional address.

16. The memory according to claim 15, comprising a parallel-type command interface configured to simultaneously receive all bits of a word of a command received by the memory.

* * * * *